United States Patent
Price et al.

(10) Patent No.: US 7,786,388 B2
(45) Date of Patent: Aug. 31, 2010

(54) CARD INSULATOR WITH PROVISION FOR CONFORMANCE TO COMPONENT HEIGHT CHANGES

(75) Inventors: Kirk Barrows Price, San Jose, CA (US); Hitoshi Shindo, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 492 days.

(21) Appl. No.: 11/877,797

(22) Filed: Oct. 24, 2007

(65) Prior Publication Data

US 2009/0107697 A1     Apr. 30, 2009

(51) Int. Cl.
*H01B 17/56* (2006.01)
*H01B 3/00* (2006.01)
*H05K 7/06* (2006.01)
*G11B 5/82* (2006.01)

(52) U.S. Cl. ............... 174/137 R; 174/138 R; 360/135; 360/97.02; 361/736

(58) Field of Classification Search ............ 174/137 B, 174/138 R, 137 R, 138 G, 135; 360/97.02, 360/97.03, 135, 97.01; 361/816, 736, 679.01, 361/679.02, 737, 832

See application file for complete search history.

(56) References Cited

U.S. PATENT DOCUMENTS

| | | | | |
|---|---|---|---|---|
| 5,235,482 A | * | 8/1993 | Schmitz | 360/97.02 |
| 5,282,100 A | * | 1/1994 | Tacklind et al. | 360/97.02 |
| 5,757,580 A | * | 5/1998 | Andress et al. | 360/97.02 |
| 5,892,663 A | | 4/1999 | Bolinger et al. | |
| 6,288,866 B1 | * | 9/2001 | Butler et al. | 360/97.01 |
| 6,411,463 B1 | * | 6/2002 | Janik et al. | 360/97.01 |
| 6,674,608 B1 | * | 1/2004 | Bernett | 360/97.01 |
| 6,674,652 B2 | | 1/2004 | Forte et al. | |
| 6,744,633 B1 | | 6/2004 | Dials et al. | |
| 6,922,337 B2 | | 7/2005 | Malone et al. | |
| 6,958,884 B1 | * | 10/2005 | Ojeda et al. | 360/97.02 |
| 7,013,558 B2 | | 3/2006 | Bachman | |
| 2004/0071989 A1 | | 4/2004 | Kumakura | |
| 2005/0219738 A1 | | 10/2005 | Iida et al. | |
| 2005/0237663 A1 | | 10/2005 | Nguyen | |

OTHER PUBLICATIONS

Electro-Wind Supply Inc., Flexible Insulations, Apr. 2003.

* cited by examiner

*Primary Examiner*—Angel R Estrada

(57) ABSTRACT

A card insulator is formed with slits that conform to height changes required by the components mounted to a card. The insulative sheet has simple linear slits that extend completely through the sheet and allow the insulator to deform with simple linear bends when contacted by the tall components mounted to the card. The linear bends allow the surface of the deformed insulator to be flexible without buckling the insulator and without bowing the card.

25 Claims, 4 Drawing Sheets

CARD INSULATOR WITH PROVISION FOR CONFORMANCE TO COMPONENT HEIGHT CHANGES

BACKGROUND OF THE INVENTION

1. Technical Field

The present invention relates in general to insulating components located on a printed circuit board and, in particular, to an improved system, method, and apparatus for a card insulator having features that conform to height changes required by the components located on the card.

2. Description of the Related Art

Some hard disk drives (HDD) have a printed circuit board or card with components mounted thereto that face toward the enclosure or casting of the HDD. The components are typically electrically insulated from contact with the enclosure. One way of insulating the components is to position a thin, non-conductive sheet between the components and the enclosure. The sheet is usually flat and flexible, and may comprise a layer of laminated foam.

The components mounted to the card vary in size, particularly with regard to the height that they protrude from the surface of the card. As a result, card insulators tend to bow or deform in the areas where the clearances between the enclosure and the components is small. This problem is particularly acute with mobile and server HDDs having this type of card configuration.

One prior art solution to this problem is to provide holes in the insulator sheet for accommodating the tall components. For example, U.S. Pat. No. 6,674,652 to Forte, discloses cutouts 406 (FIGS. 2 and 3) in a shield wrap 400 for such purposes. Although this solution solves the card bowing problem, it defeats the primary purpose of the card insulator which is to protect components from accidental electrical shorting of the components to the base casting of the hard disk drive.

Another solution is disclosed in U.S. Patent App. Pub. 2005/0237663 to Nguyen. That reference shows and describes a film formed with permanent pockets 21 (FIG. 2) that are precisely contoured to the shapes and sizes of the underlying components. Although each of these prior art designs is workable, an improved solution for a card insulator having features that accommodate height changes required by the components located on the card without sacrificing the insulative purposes of the device would be desirable.

SUMMARY OF THE INVENTION

Embodiments of a system, method, and apparatus for a card insulator having features that conform to height changes required by the components located on the card are disclosed. The invention comprises an insulative sheet having simple linear slits formed in the base film of the card insulator. The slits extend completely through the sheet and allow the insulator to deform with simple linear bends when contacted by the tall components mounted to the card. Since the bends are linear in nature (i.e., not two-dimensional) the surface of the deformed insulator can be flexible without buckling the insulator and without bowing the card itself.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the present invention, which will become apparent, are attained and can be understood in more detail, more particular description of the invention briefly summarized above may be had by reference to the embodiments thereof that are illustrated in the appended drawings which form a part of this specification. It is to be noted, however, that the drawings illustrate only some embodiments of the invention and therefore are not to be considered limiting of its scope as the invention may admit to other equally effective embodiments.

DETAILED DESCRIPTION OF THE INVENTION

Figure 1:
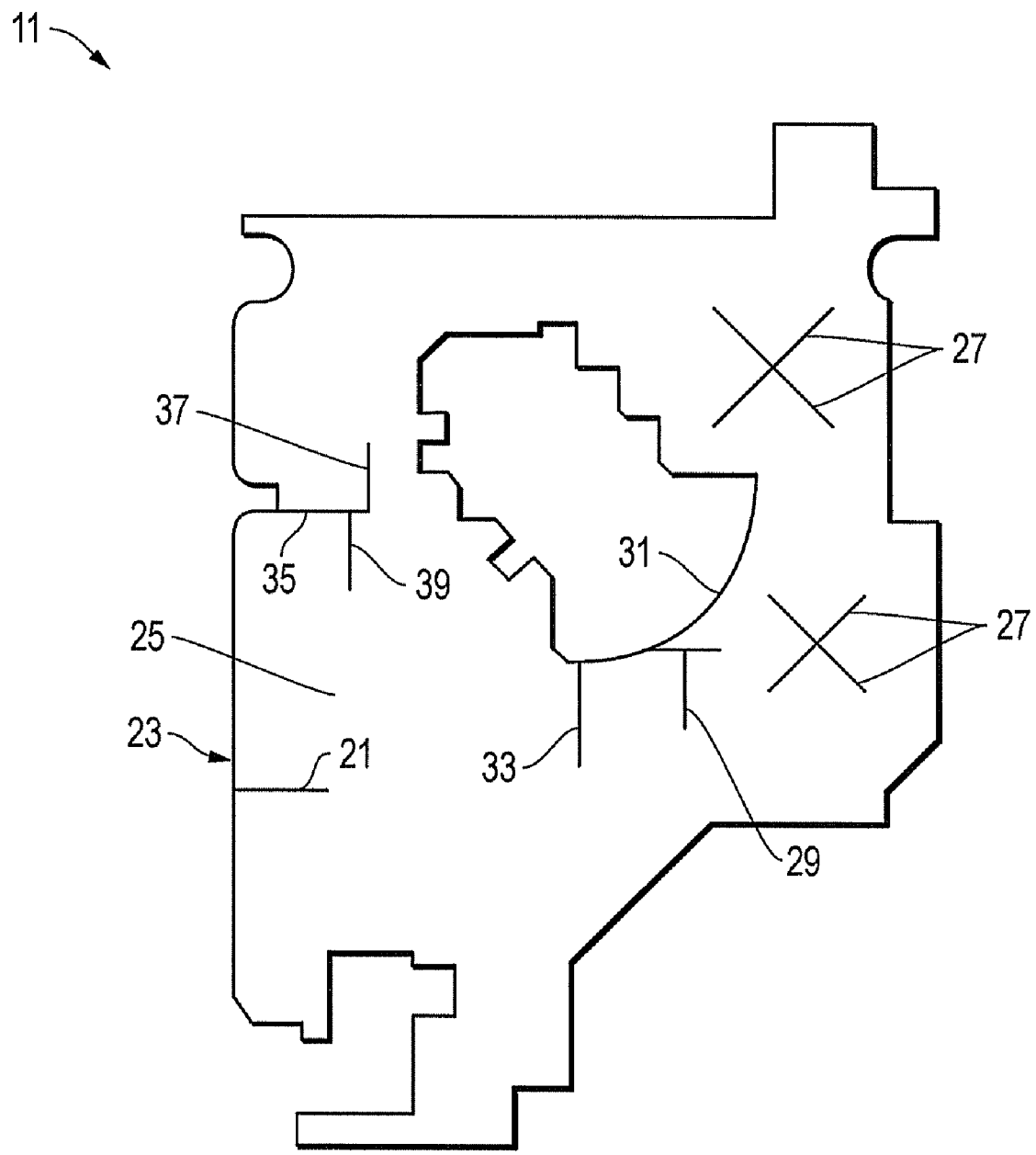
FIG. 1 is a plan view of one embodiment of a card insulator constructed in accordance with the invention.
Figure 2:
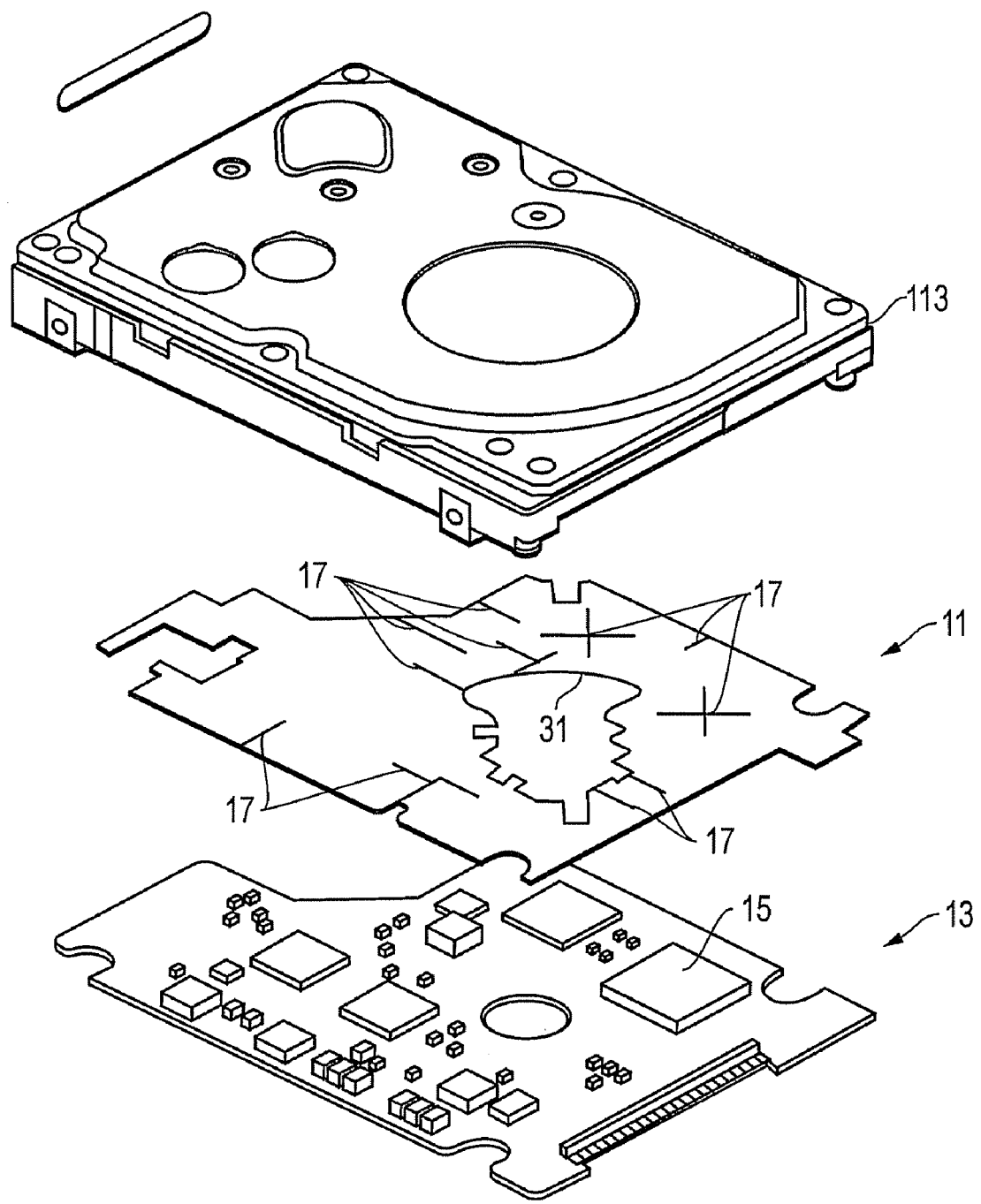
FIG. 2 is an exploded view of the card insulator, a card and a hard disk drive enclosure constructed in accordance with the invention.
Figure 3:
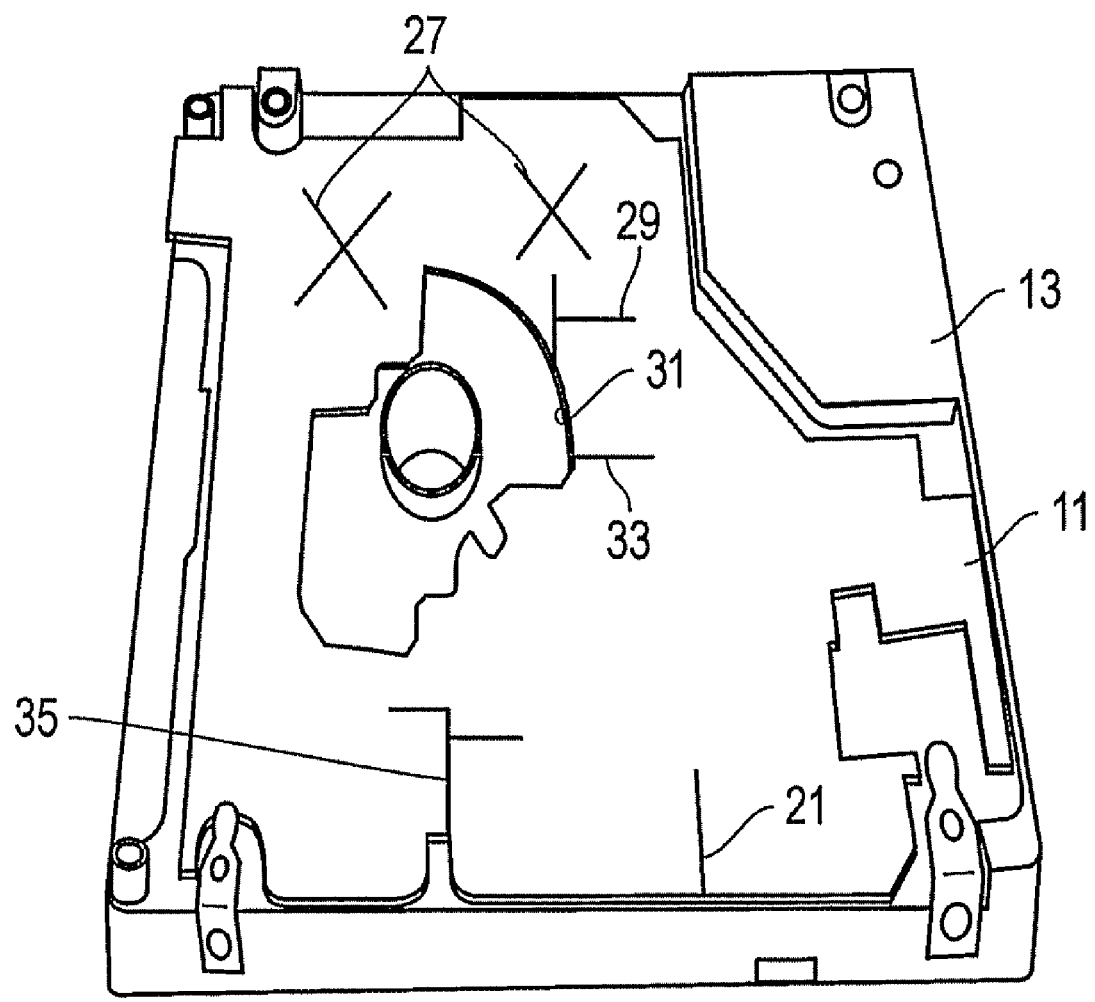
FIG. 3 is a plan view of the card insulator installed on a card and is constructed in accordance with the invention.
Figure 4:
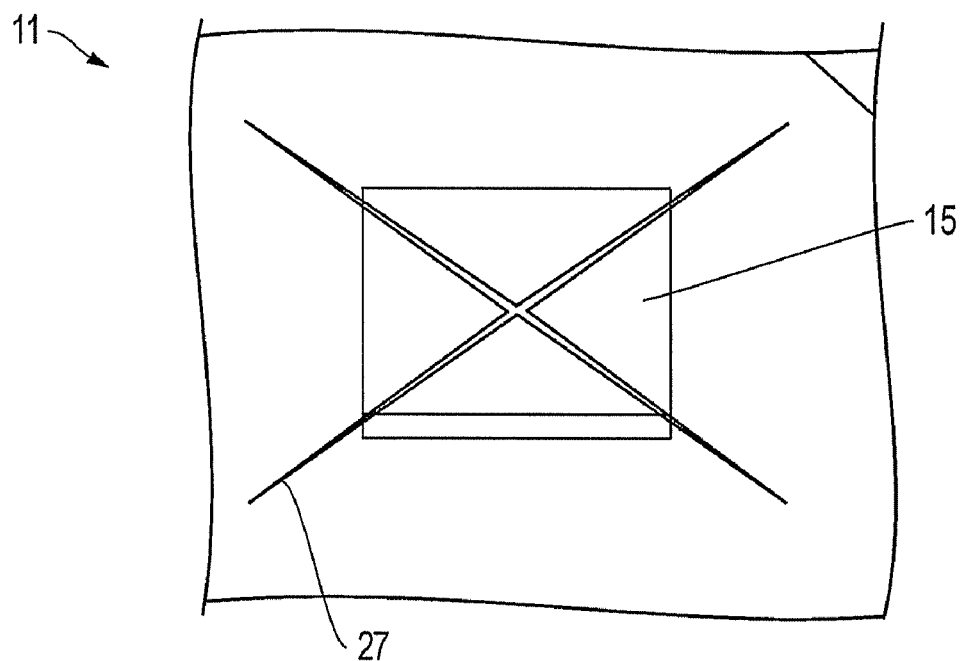
FIG. 4 is an enlarged isometric view of a portion of the card insulator and card and is constructed in accordance with the invention.

Referring to FIGS. 1-4, embodiments of a system, method and apparatus for a sheet 11 of insulation for a printed circuit board or card 13 are disclosed. The sheet 11 has various features 17 (FIG. 2) that conform to height changes required by the components 15 located on the card 13. The invention comprises a very thin insulative film having simple linear slits formed in the base film of the card insulator. In one embodiment, the sheet comprises a film formed from a single material that has a thickness of approximately 50 µm. In another embodiment, the sheet comprises a laminate formed from a layer of film and a layer of foam.

The linear slits extend completely through the sheet and allow the insulator to deform with simple linear bends when contacted by the tall components mounted to the card. The linear slits also give the sheet flexibility to follow the Z-height profiles of the respective components. For example, for large area components such as DRAMs, a slit configuration in the form of an 'x' may be used. Other embodiments may utilize a single straight line slit, T-shaped slits, or any other combination of linear slit components.

Since the bends are linear in nature (i.e., not two-dimensional) the surface of the deformed insulator can be flexible without buckling the insulator and without bowing the card itself. An insulator constructed in this manner ensures that every component on the card is insulated from the base casting. The insulator may be simply positioned to lay between the card and base casting to permit a flexible range of motion. However, the clearance between the card and base casting is relatively small, so the insulator cannot be removed without loosening the fasteners that join the card to the base casting. In other embodiments, the insulator may be fastened or otherwise secured to the card, the base casting or both components.

Referring again to the drawings, one embodiment of the sheet 11 comprises a plurality of formations 17 (FIG. 2) formed in the sheet. Each of the formations 17 has at least one linear slit that extends completely through the sheet 11 to enable flexible linear bends in the sheet. In one embodiment (FIG. 1), at least one of the formations 17 is a single linear slit 21. Some of the single linear slits 21 extend from an outer edge or perimeter 23 of the sheet 11 into an interior 25 of the sheet.

In one embodiment, at least one of the formations 17 is a pair of linear slits 27 that cross to form a shape resembling the letter 'x.' This configuration is particularly well suited for accommodating large area components such as DRAMs. The pair of linear slits 27 may be formed in the interior 25 of the sheet such that they do not intersect an outer edge 23 of the sheet. In addition, the pair of linear slits 27 may be equal in length and perpendicular to each other. In another embodiment, at least one of the formations comprises a second pair of linear slits 29 that intersect to form a shape resembling the letter 'T.' The second pair of linear slits 29 may be perpendicular to each other, and one of the second pair of linear slits may bisect the other.

The sheet 11 may be formed with an open aperture 31 as shown in the interior 25 thereof. In one embodiment, the open aperture 31 extends completely through the sheet for accommodating other structural requirements and does not intersect the perimeter 23 of the sheet. One or more of the formations 17, such as single linear slit 33 and T-slits 29, may intersect the aperture 31.

In one embodiment, at least one of the formations is a first linear slit 35 that extends from the perimeter 23 of the sheet. A second linear slit 37 extends orthogonally from an end of the first linear slit 35 opposite the perimeter 23 and in one direction. A third linear slit 39 extends orthogonally from the first linear slit 35 between the perimeter 23 and the second linear slit 37 in a second direction that is opposite to the first direction. In each example, the formations 17 enable the sheet 11 to follow Z-height profiles of respective ones of the components 15 mounted to the circuit board 13.

Figure 5:
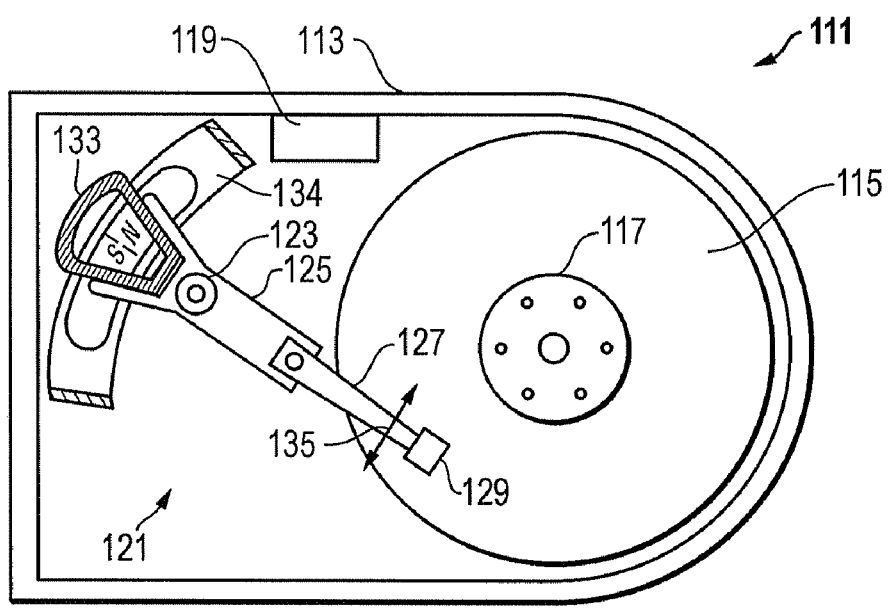
FIG. 5 is a plan view of some of the components of a hard disk drive.

Referring now to FIG. 5, a schematic drawing of one embodiment of an information storage system comprising a magnetic hard disk file or drive 111 for a computer system is shown. Drive 111 has an outer housing or base 113 (FIGS. 2 and 5) containing at least one magnetic disk 115. Disk 115 is rotated by a spindle motor assembly having a central drive hub 117. An actuator 121 comprises one or more parallel actuator arms 125 in the form of a comb that is pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and suspension 127. A magnetic read/write transducer or head is mounted on a slider 129 and secured to a flexure that is flexibly mounted to each suspension 127. The read/write heads magnetically read data from and/or magnetically write data to disk 115. The level of integration called the head gimbal assembly is the head and the slider 129, which are mounted on suspension 127. The slider 129 is usually bonded to the end of suspension 127. The head is typically formed from ceramic or intermetallic materials and is pre-loaded against the surface of disk 115 by suspension 127.

Suspensions 127 have a spring-like quality which biases or urges the air bearing surface of the slider 129 against the disk 115 to enable the creation of the air bearing film between the slider 129 and disk surface. A voice coil 133 housed within a voice coil motor magnet assembly 134 is also mounted to arms 125 opposite the head gimbal assemblies. Movement of the actuator 121 (indicated by arrow 135) by controller 119 moves the head gimbal assemblies radially across tracks on the disk 115 until the heads settle on their respective target tracks.

While the invention has been shown or described in only some of its forms, it should be apparent to those skilled in the art that it is not so limited, but is susceptible to various changes without departing from the scope of the invention.

What is claimed is:

1. An insulator for insulating components mounted to a printed circuit board, comprising:
   a sheet formed from an electrically non-conductive material; and
   a plurality of formations formed in the sheet, each of the formations having at least one linear slit that extends completely through the sheet to enable flexible linear bends in the sheet, at least one of the formations is a single linear slit, and at least one of the formations is a pair of linear slits that cross each other.

2. An insulator according to claim 1, wherein the single linear slit extends from an outer edge of the sheet into an interior of the sheet, and the pair of linear slits form a shape resembling the letter 'x.'

3. An insulator according to claim 1, wherein the pair of linear slits are formed in an interior of the sheet and do not intersect an outer edge of the sheet.

4. An insulator according to claim 1, wherein the pair of linear slits are equal in length and perpendicular to each other.

5. An insulator according to claim 1, wherein the sheet comprises a film formed from a single material that has a thickness of approximately 50 µm.

6. An insulator according to claim 1, wherein the sheet comprises a laminate formed from a layer of film and a layer of foam.

7. An insulator according to claim 1, wherein at least one of the formations comprises a second pair of linear slits that intersect to form a shape resembling the letter 'T.'

8. An insulator according to claim 7, wherein the second pair of linear slits are perpendicular to each other, and one of said second pair of linear slits bisects the other.

9. An insulator according to claim 1, wherein the sheet is formed with an open aperture in an interior thereof that extends completely through the sheet and does not intersect a perimeter of the sheet.

10. An insulator according to claim 9, wherein at least one of the formations intersects the aperture.

11. An insulator according to claim 1, wherein at least one of the formations is a first linear slit extending from a perimeter of the sheet, a second linear slit extending from an end of said first linear slit opposite the perimeter and in one direction, and a third linear slit extending from the first linear slit between the perimeter and the second linear slit in a second direction.

12. A hard disk drive, comprising:
   an enclosure;
   a disk rotatably mounted to the enclosure and having magnetic media;
   an actuator pivotally mounted to the disk and having a head for reading data from the disk;
   a printed circuit board mounted to the enclosure and having a plurality of components protruding toward the enclosure; and
   a sheet located between the enclosure and the components, the sheet being formed from an electrically non-conductive material for electrically insulating the components from the enclosure, the sheet having a plurality of formations formed in the sheet, each of the formations having at least one linear slit that extends completely through the sheet to enable flexible linear bends in the sheet, at least one of the formations is a single linear slit, and at least one of the formations is a pair of linear slits that cross to form a shape resembling the letter 'x.'

13. A hard disk drive according to claim 12, wherein the single linear slit extends from an outer edge of the sheet into an interior of the sheet.

14. A hard disk drive according to claim 12, wherein the pair of linear slits are formed in an interior of the sheet and do not intersect an outer edge of the sheet.

15. A hard disk drive according to claim 12, wherein the pair of linear slits are equal in length and perpendicular to each other.

16. A hard disk drive according to claim 12, wherein the sheet comprises a film formed from a single material that has a thickness of approximately 50 µm.

17. A hard disk drive according to claim 12, wherein the sheet comprises a laminate formed from a layer of film and a layer of foam.

18. A hard disk drive according to claim 12, wherein the formations enable the sheet to follow Z-height profiles of respective ones of the components mounted to the circuit board.

19. A hard disk drive according to claim 12, wherein the pair of linear slits cover a DRAM.

20. A hard disk drive according to claim 12, wherein at least one of the formations comprises a second pair of linear slits that intersect to form a shape resembling the letter 'T.'

21. A hard disk drive according to claim 20, wherein the second pair of linear slits are perpendicular to each other, and one of said second pair of linear slits bisects the other.

22. A hard disk drive according to claim 12, wherein the sheet is formed with an open aperture in an interior thereof that extends completely through the sheet and does not intersect a perimeter of the sheet.

23. A hard disk drive according to claim 22, wherein at least one of the formations intersects the aperture.

24. A hard disk drive according to claim 12, wherein at least one of the formations is a first linear slit extending from a perimeter of the sheet, a second linear slit extending orthogonally from an end of said first linear slit opposite the perimeter and in one direction, and a third linear slit extending orthogonally from the first linear slit between the perimeter and the second linear slit in a second direction that is opposite to the first direction.

25. A hard disk drive according to claim 12, wherein the sheet is merely located between the enclosure and the components, and the sheet is not secured to the enclosure, the components or the printed circuit board.

* * * * *